(12) United States Patent
Tastevin

(10) Patent No.: US 8,609,520 B2
(45) Date of Patent: Dec. 17, 2013

(54) CARBON TAPE INTENDED TO RECEIVE A LAYER OF A SEMICONDUCTOR MATERIAL

(75) Inventor: Robert Tastevin, Saint Marcel Bel Accueil (FR)

(73) Assignee: Solarforce, Bourgoin Jallieu (FR)

( * ) Notice: Subject to any disclaimer, the term of this patent is extended or adjusted under 35 U.S.C. 154(b) by 0 days.

(21) Appl. No.: 13/642,897

(22) PCT Filed: Apr. 8, 2011

(86) PCT No.: PCT/FR2011/050808
§ 371 (c)(1),
(2), (4) Date: Oct. 23, 2012

(87) PCT Pub. No.: WO2011/138532
PCT Pub. Date: Nov. 10, 2011

(65) Prior Publication Data
US 2013/0045590 A1    Feb. 21, 2013

(30) Foreign Application Priority Data
May 4, 2010   (FR) ...................................... 10 53439

(51) Int. Cl.
*H01L 21/00*   (2006.01)
(52) U.S. Cl.
USPC ............................................ 438/500; 117/13
(58) Field of Classification Search
USPC .................................... 438/478, 500; 117/13
See application file for complete search history.

(56) References Cited

U.S. PATENT DOCUMENTS 4,520,752 A * 6/1985 Belouet .......................... 118/405
8,092,594 B2 * 1/2012 Belouet ............................ 117/16

FOREIGN PATENT DOCUMENTS

FR    2887262    12/2006

OTHER PUBLICATIONS

International Search Report dated Oct. 14, 2010.

* cited by examiner

*Primary Examiner* — Bradley K Smith
(74) *Attorney, Agent, or Firm* — Sofer & Haroun, LLP

(57) ABSTRACT

A carbon ribbon (16) has two faces (20, 22) and two longitudinal ends (34, 36), at least one of the faces of the ribbon (16') having a central portion (20a, 22a) situated between the two longitudinal ends (34, 36), which central portion is to receive a deposit of a layer of a semiconductor material (30, 32). The ribbon further includes, on at least one of its races (20, 22), at least one longitudinal groove (17) situated between one of said ends (34, 36) and the central portion (20a, 22a), and in that the longitudinal groove (17) is shaped in such a manner that when the layer of the semiconductor material is deposited, the semiconductor material (30, 32) filling the groove (17) forms a protuberance (31) adjacent to one of the longitudinal ends (34, 36) of one of the faces (20, 22) of the carbon ribbon.

18 Claims, 3 Drawing Sheets

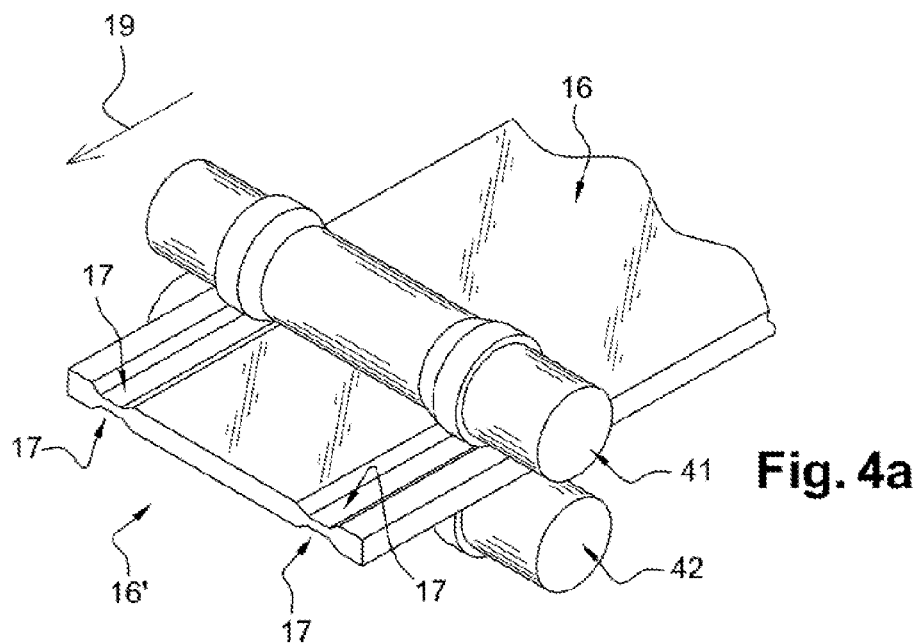
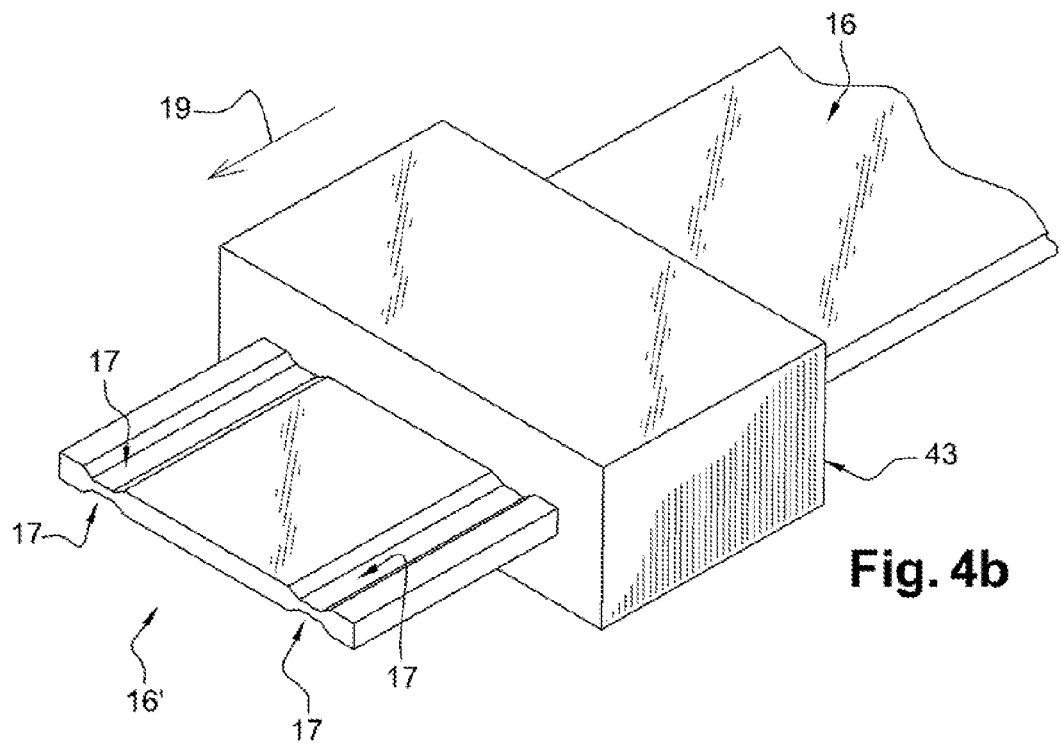

US 8,609,520 B2

CARBON TAPE INTENDED TO RECEIVE A LAYER OF A SEMICONDUCTOR MATERIAL

RELATED APPLICATIONS

This application is a National Phase Application of PCT/FR2011/050808, filed on Apr. 8, 2011, which in turn claims the benefit of priority from French Patent Application No. 10 53439 filed on May 4, 2010, the entirety of which are incorporated herein by reference.

BACKGROUND

1. Field of the Invention

The present invention relates to a carbon ribbon for receiving a layer of semiconductor material on at least one of its faces, to a method of forming said carbon ribbon, and also to a method of depositing a layer of semiconductor material on at least one of the faces of the carbon ribbon.

2. Description of Related Art

Photovoltaic cells comprise thin plates of semiconductor material, with the most commonly used material presently being polycrystalline silicon.

The invention applies most particularly to pulling silicon ribbons for use in fabricating photovoltaic cells, with the description below thus relating to silicon, it being understood that the invention applies equally to other semiconductor materials such as germanium and type III-V semiconductor compounds of the GaAs family with congruent or quasi-congruent melting. The silicon plates are preferably obtained from a layer of silicon that forms a film deposited on a carbon substrate by pulling the substrate through a bath of molten silicon. The substrate has the form of a ribbon.

FIG. 1 is a general diagram showing the prior art method referred to as the ribbon on temporary substrate (RTS) method. A crucible 10 fitted with heater means (not shown) contains a bath 12 of molten silicon in liquid form. The bottom of the crucible has a slot 14. Using pulling means (not shown), a carbon ribbon 16 of small thickness (of the order of 200 micrometers (μm) to 350 μm) is pulled substantially vertically upwards in the direction of arrow 18 through the silicon bath 12 at substantially constant speed. The two faces 20 and 22 of the ribbon are initially covered in a thin layer of pyrolytic carbon 24 (thickness about 1 μm to 5 μm). The molten silicon wets the two faces 20 and 22 of the ribbon, and a meniscus 26 of liquid silicon forms on each face of the ribbon, with a solid-liquid connection line 28 that is situated at about 6.8 millimeters (mm) from the surface of the bath in the central portion of the ribbon. A thin layer of silicon 30-32 then forms on each of the two faces 20 and 22 of the carbon ribbon. The shape and the dimensions of she slot 14 are adapted firstly to allow the carbon ribbon 16 to penetrate into the crucible, and secondly to avoid molten silicon from flowing out through the slot. Although it is advantageous to obtain two silicon films 30 and 32 simultaneously, one film on each face of the ribbon, it is possible to use a technique in which only one film is obtained by preventing silicon from becoming deposited on one of the two faces.

The RTS method is described for example in patents FR 2 386 359 and FR 2 561 139.

That pulling method is nevertheless confronted with the problem of the liquid silicon meniscus being unstable in the proximity of each longitudinal end 34-36 of the carbon ribbon 16 it has been found that the solid-liquid connection line 28 tends to drop in height typically from about 6.8 mm to a height in the range 2 mm to 4 mm relative to the surface of the silicon bath at the longitudinal, ends of the ribbon, over a width of about 5 mm from each longitudinal end. As a result, the thickness of the silicon layer 30 or 32 that is deposited on each face of the carbon ribbon decreases going towards the longitudinal ends 34 and 36 down to a value of practically zero.

FIG. 2 is a diagram showing the progressive thinning as the longitudinal ends of the semiconductor layers obtained by the prior art method shown in FIG. 1. The section of the carbon ribbon 16 shown in cross-section and without the layers 24 of pyrolytic carbon (or pyrocarbon) is substantially rectangular in shape. The two semiconductor layers 30 and 32 are deposited simultaneously on the two faces 20 and 22 respectively of the ribbon. In the zones 38-40 and 42-44 adjacent to the two longitudinal ends 34 and 36 respectively of the ribbon, the thickness of the layers decreases progressively over a distance that is typically about 5 mm. Semiconductor films made in this way are therefore particularly fragile at the ends. In addition, it is found that nucleation from grains of small dimensions propagates in the side portions of the film, thereby decreasing the photovoltaic performance of the silicon film.

Solutions to the above problem are proposed in patents FR 2 568 490 and FR 2 550 965. Those solutions consist in raising the level of the solid-liquid line at the longitudinal ends of the carbon ribbon with the help of external means placed close to the longitudinal ends of the ribbon. Thus, the first above-mentioned patent makes use of plates that locally raise the level of the bath of molten silicon by capillarity, and the second above-mentioned patent proposes placing a trough in register with each longitudinal end of the silicon ribbon, likewise for locally raising the level of the bath of molten silicon. Those solutions complicate fabricating the pulling structure and also the pulling operation itself.

Another solution is provided by document FR 2 887 262, which does not call on external means. It consists in adapting the shape to the longitudinal ends of the carbon ribbon used as a temporary support for the semiconductor layers, in such a manner as to increase the thickness of the semiconductor layers deposited on the longitudinal ends. The longitudinal ends of the carbon ribbon are shaped by continuously upsetting those ends using mechanical means in order to form rims.

Once the longitudinal ends have been formed in that way, the carbon ribbon is conventionally wound onto a reel type support, suitable for easy use during subsequent steps such as depositing a layer of pyrolytic carbon or pulling the ribbon through the bath of molten semiconductor material.

More particularly, that winding is performed simultaneously with a recoverable insert film, the insert film being essential to avoid flattening the rim during winding. During unwinding of the carbon ribbon, the insert, film then needs to be separated from the carbon ribbon and recovered for future use.

It can be observed for example that it is necessary to provide for the carbon ribbon and said insert film to be wound together in order to enable the ribbon to be put into place on a reel, in order to recover the insert film before the step of depositing pyrolytic carbon on the carbon ribbon, to make provision for the insert film to be wound together with the ribbon after the step of depositing the pyrolytic carbon, and in order to recover the insert before the step of depositing the semiconductor material.

Nevertheless, each of those operations in the presence of the insert film makes the sequences of winding and unwinding the carbon ribbon more complex to perform and requires numerous parameters to be managed.

OBJECTS AND SUMMARY

The object of the present invention is to mitigate the drawbacks of the prior art in particular by proposing a carbon ribbon that enables a layer of semiconductor material to be made that is not weakened on the longitudinal ends of the carbon ribbon, while facilitating the operations of winding and unwinding the carbon ribbon.

The present invention provides a carbon ribbon having two (longitudinal) faces and two longitudinal ends, at least one of the faces of the ribbon having a central portion situated between the two longitudinal ends, which central portion is to receive a deposit of a layer of a semiconductor material, the ribbon being characterized in that it further includes, on at least one of its faces, at least one longitudinal groove situated between one of said ends and the central portion, and in that the longitudinal groove is shaped in such a manner that when the layer of said semiconductor material is deposited, the semiconductor material filling said groove forms a protuberance adjacent to one of the longitudinal ends of one of the faces of the carbon ribbon.

Thus, the longitudinal groove(s) of the carbon ribbon of the invention serve advantageously to modify the shape of the wetting surface of the molten semiconductor material once the groove(s) is/are filled with said material, thereby increasing the thickness of the layer of semiconductor material at its ends. As a result, said layer of semiconductor material has a thickness that is, substantially constant over its entire surface, including at its ends.

More particularly, said longitudinal groove may advantageously be made up of a strip forming the bottom of the groove and lying between two substantially rectilinear strips that slope relative to the face of the carbon ribbon including said groove. More particularly, the strip forming the bottom of the groove may be curved or substantially rectilinear.

In a particular embodiment, the carbon ribbon includes two longitudinal grooves in at least one of its faces, the grooves being situated between the two longitudinal ends of the ribbon.

In another particular embodiment, the carbon ribbon includes at least one longitudinal groove in each of its faces, each groove being situated between the two longitudinal ends of the ribbon.

In a preferred embodiment, the carbon ribbon includes two longitudinal grooves in each of its faces, the grooves being situated between the two longitudinal ends of the ribbon.

More particularly, each of the faces of the carbon ribbon includes, a longitudinal portion at each longitudinal end, the longitudinal portion preferably being designed not to receive a deposit of a layer of a semiconductor material.

More particularly, when the carbon ribbon has two longitudinal grooves in each of its faces, the longitudinal ends of the carbon ribbon are thus not designed to receive a deposit of a layer of semiconductor material.

In a particular embodiment, in cross-section, the thickness at the longitudinal ends of the carbon ribbon, and also the thickness in the central portions thereof, are greater than the thickness in the or each longitudinal groove.

Furthermore, the thicknesses of the carbon ribbon respectively at its longitudinal ends and in its central portions are substantially identical. Thus, at least one of the longitudinal portions and the central portion in a given face lie in the same plane.

This characteristic makes it possible to start with a plane carbon ribbon having two plane and continuous surfaces that are subjected to forming in order to create the longitudinal groove(s) in the thickness of said ribbon.

This means that the thickness of the carbon ribbon of the invention, in cross-section, is substantially identical over its entire length, in particular at its longitudinal ends and in its central portions, with the exception of its thickness in the longitudinal groove(s).

The central portion of at least one of the faces of the carbon ribbon of the invention may preferably be substantially plane, having no texturing.

The carbon ribbon of the invention may have a given thickness ($e0$) lying in the range 200 μm to 350 μm, and preferably a given thickness of 250 μm. This given thickness ($e0$) is naturally greater than the thickness ($e1$) of the carbon ribbon in the or each longitudinal groove.

In an embodiment, the two rectilinear substantially sloping strips of the longitudinal groove are connected by curved zones respectively to one of the longitudinal portions and to the central portion.

In another embodiment, the two rectilinear substantially sloping strips of the longitudinal groove are connected by curved zones to the strip forming the bottom of the groove.

These two embodiments may be combined.

Preferably, the strip forming the bottom of the groove, when it is substantially rectilinear, may be substantially parallel to one of the faces of the carbon ribbon.

Angles are defined below in order to characterize more particularly the longitudinal, groove and the slopes of its substantially rectilinear strips, these angles serving to optimize the wetting angle of the semiconductor material close to the longitudinal end where the longitudinal groove is situated, in order to increase the thickness of the end of the layer of semiconductor material.

In a first embodiment, in cross-section, the angle $\alpha 1$ formed between the longitudinal portion and that one of the substantially rectilinear sloping strips (sloping relative to the face of the carbon ribbon that includes said groove) that is closer to the longitudinal, end is defined such that $90° < \alpha 1 < 180°$, and preferably such that $120° < \alpha 1 < 160°$.

The angle $\alpha 1$ serves advantageously to optimize the increase in the thickness of the layer of semiconductor material. For this reason, it must preferably not be equal to 90°, and must be greater than 90°.

In a second embodiment, in cross-section, the angle $\beta 1$ formed between the central portion of the ribbon and that one of the substantially rectilinear sloping strips (sloping relative to the face of the carbon ribbon that includes said groove) that is closer to the central portion is defined such that $90° < \beta 1 < 180°$, preferably $120° < \beta 1 < 160°$.

The angle $\beta 1$ must preferably not be equal to 90°, being greater than 90° in order to prevent the semiconductor material being weak between the central portion and that one of the substantially rectilinear sloping strips that is closer to the central portion.

In a third embodiment, when the strip forming the bottom of the groove is substantially rectilinear, in cross-section, the angle $\alpha 2$ formed between that one of the substantially rectilinear sloping strips (sloping relative to the face of the carbon ribbon including said groove) that is closer to the longitudinal end and the substantially rectilinear strip forming the bottom of the groove is defined such that $90° < \alpha 2 < 180°$, preferably such that $120° < \alpha 2 < 160°$.

In a fourth embodiment, when the strip forming the bottom of the groove is substantially rectilinear, in cross-section, the angle $\beta 2$ formed between that one of the rectilinear sloping strips (sloping relative to the face of the carbon ribbon including said groove) that is closer to the central portion and the substantially rectilinear strip forming the bottom of the groove is defined such that $90° < \beta 2 < 180°$, preferably $120° < \beta 2 < 160°$.

Naturally, it is possible to envisage combining at least two of the four above-mentioned embodiments.

In a particularly preferred embodiment, α1 and α2 are substantially equal and/or β1 and β2 are substantially equal.

Furthermore, the width (l1) of the longitudinal groove may be no more than 1 mm, and preferably at least 200 µm.

The width (l1) is the difference (distance) between the edges of the two substantially rectilinear sloping strips flush with the face of the carbon ribbon.

The width (l2) of the longitudinal portion at the longitudinal end may be at least 50 µm. In other words, this width is the difference (distance) between the longitudinal groove and the longitudinal end. The width. (l2) is preferably at most 500 µm, and preferably at most 200 µm.

The depth (p) of the longitudinal groove may be at least 50 µm, and preferably at most 70 µm, but it naturally depends on the thickness of the ribbon.

The depth (p) is the maximum depth of the longitudinal groove. In other words, it corresponds to the greatest difference (distance) between firstly the bottom of the groove and secondly the longitudinal portion closer to the groove, at the longitudinal end, this difference being perpendicular to the longitudinal plane of symmetry of the carbon ribbon.

The invention also provides a method of forming the carbon ribbon in accordance with the invention, the method including the step consisting in forming at least said longitudinal groove in the thickness of the carbon ribbon, said longitudinal groove thus being formed in the given thickness (e0) of the carbon ribbon. It is thus easy to implement the forming step by starting with a plane carbon ribbon made up of two surfaces that are plane and continuous, which surfaces are subjected to forming at said ends in one or both of its faces in order to create the longitudinal groove(s).

By way of example, the longitudinal groove(s) may be formed by taking a carbon ribbon of given thickness (e0) and rolling it or extruding it (through a die).

The invention also provides a method of depositing a layer of a semiconductor material on at least one of the (two longitudinal) faces of the carbon ribbon of the invention, the method being characterized in that it includes the step consisting in:

i. progressively pulling the carbon ribbon preferably substantially vertically upwards lengthwise through the horizontal equilibrium surface of a bath of molten semiconductor material, which material becomes deposited on said face by wetting progressively as the carbon ribbon is pulled.

The speed at which the carbon ribbon of the invention is pulled may also have an effect on the wetting angle of the semiconductor material filling the longitudinal groove(s) The person skilled in the art can optimize the shape of the longitudinal groove(s), and in particular the value of the angle α1, relative to a given pulling speed for the carbon ribbon, in particular by taking account of the fact that the faster the puling speed, the shorter the length of time the semiconductor material is in contact with the carbon ribbon (or the layer of pyrolytic carbon), and the greater the wetting angle, and also the greater the thickness at the end of the layer of semiconductor material.

Said method may also include the step consisting in depositing a layer of pyrolytic carbon (or pyrocarbon) on said carbon ribbon, this step being performed prior to the ribbon pulling step i, or in other words prior to depositing the semiconductor material on the carbon ribbon.

When the semiconductor material is silicon, in particular, the carbon ribbon may advantageously be covered in a layer of pyrolytic carbon onto which the silicon layer is deposited, thereby avoiding forming silicon carbide between the silicon and the carbon ribbon.

The thickness of the pyrolytic carbon layer conventionally lies in the range 1 µm to 5 µm.

In order to obtain at least one plate of semiconductor material, the above-described method may also include, after step i, the steps consisting in:

ii. optionally cutting off the ends of the layer(s) of semiconductor material at its/the longitudinal ends, including the protuberances, preferably by laser; and iii. eliminating the carbon ribbon, the carbon ribbon preferably being eliminated by burning by heating the assembly constituted by the carbon ribbon and the layer(s) of semiconductor material, to high temperature.

By means of the present invention, the layer of semiconductor material does not break at its longitudinal ends since its thickness does not decrease at said ends.

Nevertheless, in order to guarantee uniform planeness over the entire surface of the layer of semiconductor material, it can be advantageous to perform above-mentioned step ii: this cutting step may be performed by cutting the longitudinal ends of the layer(s) of semiconductor material longitudinally at the angle β1, preferably while also cutting through the carbon ribbon.

In other words, the portion that is eliminated thus occupies the distance "l1+l2" in the cross-section: there thus remains only the central portion of the carbon ribbon covered in the layer of semiconductor material.

Step iii of eliminating the carbon ribbon serves to obtain a single plate of semiconductor material if the layer of semiconductor material was deposited on one face only of the carbon ribbon, or preferably serves to obtain plates of semiconductor material if the layer of semiconductor material was deposited on both faces of the carbon ribbon.

BRIEF DESCRIPTION OF THE DRAWINGS

Other characteristics and advantages of the present invention appear in the light of the description of non-limiting examples of a carbon ribbon of the invention given with reference to the annotated figures.

FIG. 4a is a diagram showing the forming method of the invention by rolling a carbon ribbon, FIG. 4b is a diagram showing the forming method of the invention by extruding a carbon ribbon through a die.

DETAILED DESCRIPTION

For reasons of clarity, elements that are the same are designated by identical references. Similarly, only those elements that are essential for understanding the invention are shown and they are shown diagrammatically, without necessarily being to scale.

Figure 1:
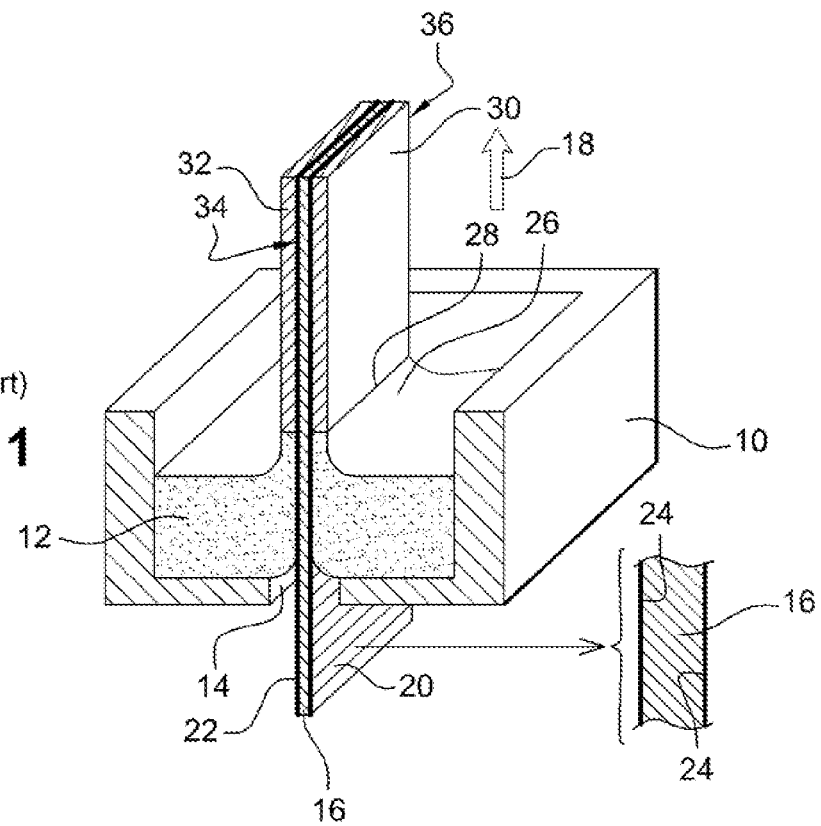
FIG. 1 is a diagram of the prior art method enabling one or two films of semiconductor material to be obtained by pulling a carbon ribbon through a bath of molten semiconductor material.
Figure 2:
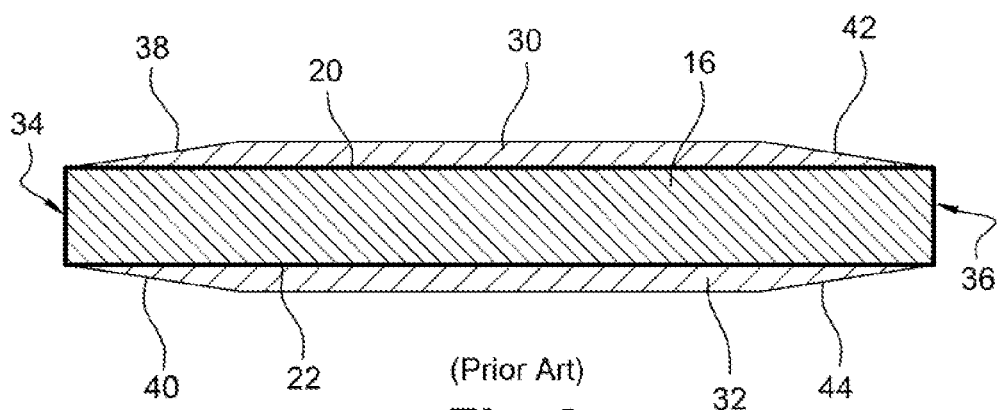
FIG. 2 is a cross-section view showing the thinning of the layers of semiconductor material that are obtained by the FIG. 1 prior art method.

FIGS. 1 and 2 are described above, and in order to facilitate understanding, elements that are common between the present invention and the prior art are given the same references.

Figure 3A:
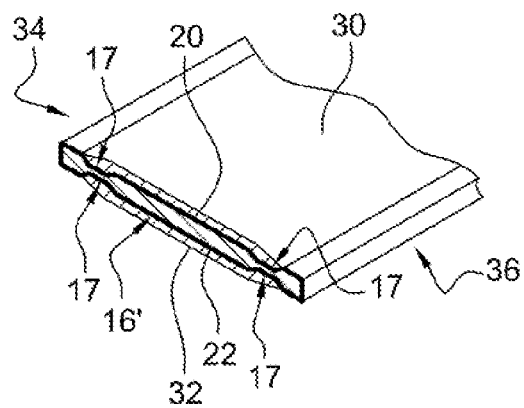
FIG. 3a is a diagrammatic view of a carbon ribbon in accordance with the invention, having both of its faces covered in respective layers of semiconductor material.

FIG. 3a is a diagrammatic view of a carbon ribbon 16' in accordance with the invention, in which the two (longitudinal) faces 20 and 22 are covered with respective layers 30 and 32 of semiconductor material. The carbon ribbon 16' also has two longitudinal, ends 34 and 36 that are not covered in any layer of semiconductor material.

On each of the faces 20 and 22 that are positioned between the two longitudinal ends 34 and 36, there are situated two longitudinal grooves 17 in accordance with the invention.

Figure 3B:
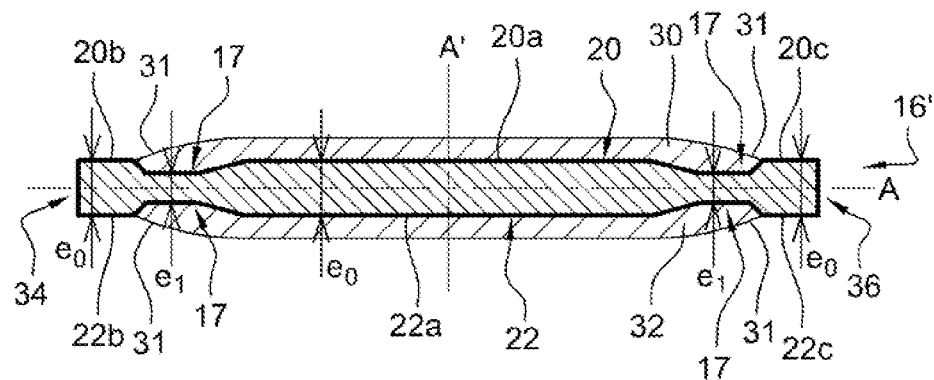
FIG. 3b is a cross-section view of the FIG. 3a carbon ribbon.

More precisely, FIG. 3b is a cross-section view of the carbon ribbon 16' of FIG. 3a.

Each face 20, 22 of the carbon ribbon has a central portion 20a, 22a situated between the two longitudinal ends 34, 36, each central portion 20a, 22a being covered in a respective layer 30, 32 of semiconductor material, unlike said ends 34, 36 which are not covered therewith.

Each face 20, 22 also has two longitudinal grooves 17 situated between the corresponding central portion 20a, 22a and a respective one of the longitudinal ends 34, 36.

More particularly, each end 34, 36 has two longitudinal portions 20b, 22b and 20c, 22c, these longitudinal portions not being covered in a layer of semiconductor material.

On each face 20 or 22 the central part 20a or 22a and the corresponding longitudinal portions 20b, 20c or 22b, 22c are in alignment (in the cross-section).

More generally, the longitudinal portions 20b, 20c of the face 20 (or the longitudinal portions 22b, 22c of the face 22) and the central portion 20a (or the central portion 22a) all lie in the same plane.

The thickness e0 of the entire carbon ribbon 16', except in the grooves 17, is greater than the thickness e1 of the carbon ribbon in each of the longitudinal grooves 17. In other words, the thickness e0 of the longitudinal ends 34 or 36 (i.e. the distance between the longitudinal portion 20b and the longitudinal portion 22b, or the distance between the longitudinal portion 20c and the longitudinal portion 22c), and the thickness e0 between the central portions 20a, 22a of each of the faces is greater than the thickness e1 of the carbon ribbon in each of the longitudinal grooves 17.

FIG. 3 is a diagram showing that the semiconductor material 30, 32 fills the grooves 17 in each of the faces 20, 22, thereby forming respective protuberances 31 (i.e. projecting portions) adjacent to the longitudinal ends 34, 36 of the carbon ribbon, and more particularly adjacent to the longitudinal portion 20b, 22b, 20c, 22c that is closest to the groove under consideration.

This means that the thickness of the carbon ribbon of the invention is substantially identical over its entire length, in particular at its longitudinal ends and in its central portions, except in the longitudinal grooves.

For reasons associated with ease of forming the carbon ribbon, in cross-section the two grooves 17 in one of the faces 20 of the carbon ribbon are symmetrical to the two grooves 17 in the other face 22 of the carbon ribbon about the longitudinal axis A (in the width of the carbon ribbon) parallel to the two faces of the carbon ribbon 16 (the longitudinal axis A may also refer to the longitudinal plane of symmetry of the carbon ribbon).

Similarly, in cross-section, the grooves 17 in each face 20, 22 close to one of the longitudinal ends 34 are symmetrical to the grooves 17 of each face 20, 22 close to the other longitudinal end 36, relative to a middle axis A' passing through the middle of the carbon ribbon and perpendicular to the axis A.

Figure 3C:
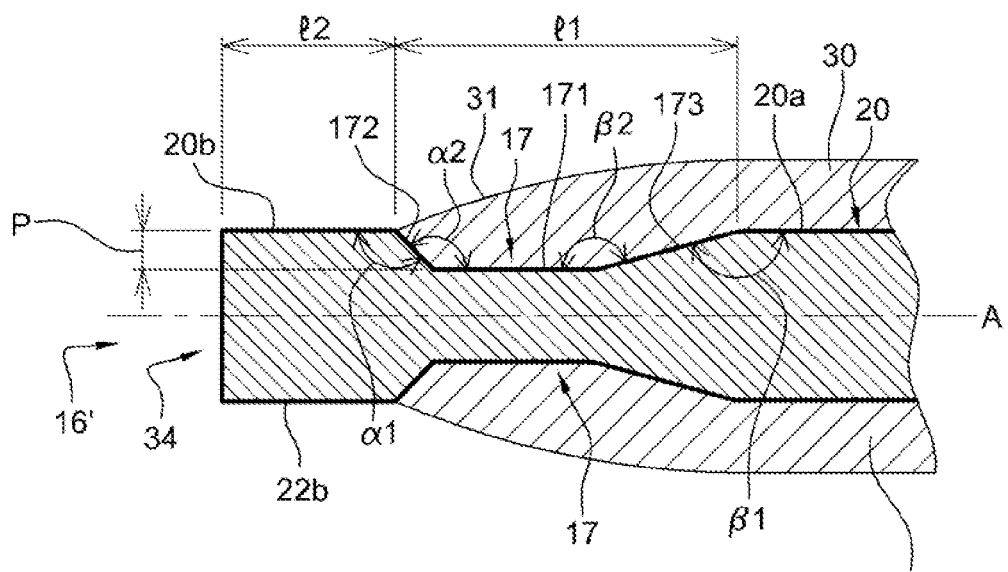
FIG. 3c is a cross-section view of one of the ends of the FIG. 3a carbon ribbon.

FIG. 3c is a cross-section view of the left end 34 of the carbon ribbon 16' of FIG. 3a.

The characteristics described in FIG. 3c for the groove 17 in the surface 20 apply likewise to all of the other grooves in the carbon ribbon 16'.

This longitudinal groove 17 is made up of a substantially rectangular strip 171 forming the bottom of the groove 17. This substantially rectilinear strip 171 is connected to and defined by two substantially rectilinear sloping strips 172 and 173, forming respective edges.

A substantially rectilinear sloping strip 172 is connected directly to the longitudinal portion 20b forming an edge, and the substantially rectilinear sloping strip 173 is directly connected to the central portion 20a forming an edge.

The connection zones between the longitudinal portion 20b and the substantially rectilinear sloping strip 172, between the substantially rectilinear sloping strip 172 and the substantially rectilinear strip 171 forming the bottom of the groove, between the substantially rectilinear strip 171 forming the bottom of the groove and the substantially rectilinear sloping strip 173, and between the substantially rectilinear sloping strip 173 and the central portion could equally well be curved zones (not shown in the figures).

In FIG. 3c, the substantially rectilinear strip 171 forming the bottom of the groove 17 is substantially parallel to the face 20 of the carbon ribbon 16'.

The angle $\alpha 1$ formed between the longitudinal portion 20b and the substantially rectilinear sloping strip 172 (strip closest to the longitudinal end 20b) is about 135°.

The angle $\beta 1$ formed between the central portion 20a and the substantially rectilinear sloping strip 173 (the sloping strip closer to the central portion 20a) is about 150°.

The angle $\alpha 2$ formed between the substantially rectilinear sloping scrip 172 closer to the longitudinal end 20b and the rectilinear strip 171 forming the bottom of the groove is about 135°.

The angle $\beta 2$ formed between the substantially rectilinear sloping strip 173 closer to the central portion 20b and the rectilinear strip 171 forming the bottom of the groove is about 150°.

Furthermore, the width l1 of the longitudinal groove may be about 200 μm. This width l1 is the greatest distance parallel to the axis A between the two substantially rectilinear sloping strips 172 and 173.

The width l2 of the longitudinal portion 20b may be of the order of 100 μm. This width l2 is the distance between the longitudinal groove and the longitudinal end.

In cross-section, where two grooves 17 face each other about the axis of symmetry A close to an end, the remaining thickness e1 of the carbon ribbon must be sufficient to ensure that said ribbon remains mechanically intact. The minimum thickness e1 for ensuring sufficient mechanical strength is preferably not less than 100 μm.

By way of example, the thickness e0 of the carbon ribbon 16' is equal to 250 μm, the thickness e1 between the two grooves 17 at the end 34 is 150 μm, and the depth p of each groove is therefore 50 μm.

Furthermore, in order to guarantee that the semiconductor material 30, 32 for use in fabricating photovoltaic cells is plane, the portion "l1+l2" as shown in FIG. 3c in cross-section may be eliminated by laser cutting. The portion "l1+l2" is cut off throughout the entire thickness of the layer(s) of semiconductor material 30, 32 together with the thickness of the carbon ribbon 16' at the angle $\beta 1$. There therefore remain only the central portions 20a and 22a of the carbon ribbon covered by the semiconductor material.

Once the portion(s) "l1+l2" has/have been cut off from the longitudinal end(s) of the layer of semiconductor material, the carbon ribbon can be eliminated by being burnt away.

FIG. 4a is a diagram showing the method of the invention for forming a carbon ribbon by rolling.

The carbon ribbon 16' of the invention may be obtained from a carbon ribbon 16 having both faces substantially plane and parallel, the carbon ribbon 16 being formed by being rolled (the direction in which the method is performed being defined by the direction of arrow 19) between two rollers 41 and 42 having surfaces including portion(s) in relief suitable for shaping grooves 17 by compressing the carbon ribbon: the groove(s) as formed in this way is/are complementary in shape to the portion(s) in relief.

In a particular application (not shown) for forming one or two grooves in only one of the faces of the carbon ribbon 16, a first roller may have one or two portions in relief as described above so as to form one or two grooves of the invention, while the second roller has no portion in relief.

FIG. 4b is a diagram showing the method of the invention for formic a carbon ribbon by extrusion through a die.

The carbon ribbon 16' of the invention may also be obtained from a carbon ribbon 16 having both faces substantially plane and parallel, which carbon ribbon 16 is shaped by being extruded (the direction in which the method is performed being defined by the direction of arrow 19) by passing through a die 43 that serves to form grooves 17 by compressing the carbon ribbon.

The number of grooves in the carbon ribbon 16', and the shape of the or each groove of the invention are not limited to the examples shown in detail in FIGS. 3a, 3b, 3c, 4a, and 4d. The carbon ribbon 16' has at least one groove in accordance with the invention, and preferably has exactly two grooves in one of its faces, and in particularly preferred manner has exactly two grooves in each of its two faces.

The invention provides a solution that is technically simple and inexpensive to the problem of the reduced thickness at the longitudinal ends of the semiconductor layers that are obtained by pulling a carbon ribbon. This improves the efficiency with which use is made of the surface of the ribbon and of the surface of the semiconductor.

The invention claimed is:

1. A carbon ribbon comprising:
   two faces; and
   two longitudinal ends, at least one of the faces of the ribbon having a central portion situated between the two longitudinal ends, which central portion is to receive a deposit of a layer of a semiconductor material,
   wherein said ribbon further comprises, on at least one of its faces, at least one longitudinal groove situated between one of said ends and the central portion, and in that the longitudinal groove is shaped in such a manner that when the layer of said semiconductor material is deposited, the semiconductor material filling said groove forms a protuberance adjacent to one of the longitudinal ends of one of the faces of the carbon ribbon.

2. A carbon ribbon according to claim 1, wherein said longitudinal groove is made up of a strip forming the bottom of the groove and lying between two substantially rectilinear strips that slope relative to the face of the carbon ribbon including said groove.

3. A carbon ribbon according to claim 1, wherein said carbon ribbon includes two longitudinal grooves in at least one of its faces, the grooves being situated between the two longitudinal ends of the ribbon.

4. A carbon ribbon according to claim 1, wherein said carbon ribbon includes two longitudinal grooves in each of its faces, the grooves being situated between the two longitudinal ends of the ribbon.

5. A carbon ribbon according to claim 1, wherein each of the faces of the carbon ribbon includes a longitudinal portion at each longitudinal end, the longitudinal portion being designed not to receive a deposit of a layer of a semiconductor material.

6. A carbon ribbon according to claim 5, wherein the two rectilinear sloping strips of the longitudinal groove are connected by curved zones respectively to one of the longitudinal portions and to the central portion.

7. A carbon ribbon according to claim 1, wherein the two rectilinear sloping strips of the longitudinal groove are connected by curved zones to the rectilinear strip forming the bottom of the groove.

8. A carbon ribbon according to claim 1, wherein the rectilinear strip forming the bottom of the groove is substantially parallel to one of the faces of the carbon ribbon.

9. A carbon ribbon according to claim 5, wherein, in cross-section, the angle α1 formed between the longitudinal portion and that one of the substantially rectilinear sloping strips that is closer to the longitudinal end is defined such that $90°<α1<180°$, and preferably such that $120°<α1<160°$.

10. A carbon ribbon according to claim 5, wherein, in cross-section, the angle β1 formed between the central portion of the ribbon and that one of the substantially rectilinear sloping strips that is closer to the central portion is defined such that $90°<β1<180°$, preferably $120°<β1<160°$.

11. A carbon ribbon according to claim 1, wherein the width (l1) of the groove is no more than 1 mm.

12. A carbon ribbon according to claim 1, wherein the width (l2) of the longitudinal portion of the longitudinal end is at least 50 μm.

13. A carbon ribbon according to claim 1, wherein the depth (p) of the longitudinal groove is at least 50 μm.

14. A method of forming a carbon ribbon as defined in claim 1, the method including the step of forming at least said longitudinal groove in the thickness of the carbon ribbon.

15. A method according to claim 14, wherein said groove is formed by rolling or by extrusion.

16. A method of depositing a layer of a semiconductor material on at least one of the faces of the carbon ribbon as defined in claim 1, said method comprising the step of:
   i. progressively pulling the carbon ribbon lengthwise through the horizontal equilibrium surface of a bath of molten semiconductor material, which material becomes deposited by wetting on said face progressively as the carbon ribbon is pulled through.

17. A method according to claim 16, wherein said method further includes the step of depositing a layer of pyrolytic carbon on said ribbon, this step being performed prior to the step i of puling the ribbon.

18. A method according to claim 16, said method further includes, after step i, the steps of:
   ii. optionally cutting off the ends of the layer(s) of semiconductor material (30, 32) at its/the longitudinal ends, including the protuberances; and
   iii. eliminating the carbon ribbon (16').

* * * * *